(12) United States Patent
Miller (10) Patent No.: US 8,435,595 B2
(45) Date of Patent: May 7, 2013

(54) CARBON NANOTUBE TRANSPARENT FILMS

(75) Inventor: Seth Adrian Miller, Englewood, CO (US)

(73) Assignee: Empire Technology Development, LLC, Wilmington, DE (US)

( * ) Notice: Subject to any disclaimer, the term of this patent is extended or adjusted under 35 U.S.C. 154(b) by 666 days.

(21) Appl. No.: 12/503,619

(22) Filed: Jul. 15, 2009

(65) Prior Publication Data

US 2011/0014455 A1   Jan. 20, 2011

(51) Int. Cl.
*B82B 1/00* (2006.01)
*C01B 31/00* (2006.01)

(52) U.S. Cl.
USPC ....... 427/122; 427/58; 427/126.1; 427/126.2; 427/162; 427/164; 427/165; 427/180; 427/202; 427/203; 427/204; 977/700; 977/742; 977/842

(58) Field of Classification Search .................... 427/180
See application file for complete search history.

(56) References Cited

U.S. PATENT DOCUMENTS

| | | | | |
|---|---|---|---|---|
| 7,045,205 | B1 * | 5/2006 | Sager ........................ | 428/304.4 |
| 2001/0044251 | A1 * | 11/2001 | Cho et al. ........................ | 445/24 |
| 2003/0030037 | A1 * | 2/2003 | Takamiya et al. ............. | 252/500 |
| 2003/0211029 | A1 * | 11/2003 | Someya et al. ............. | 423/447.3 |
| 2008/0118634 | A1 * | 5/2008 | Wei et al. ...................... | 427/108 |
| 2010/0098902 | A1 * | 4/2010 | Kotov et al. .................. | 428/105 |

OTHER PUBLICATIONS

Feng Zheng et al. Carbon Nanotube Synthesis Using Mesoporous Silica Templates Nano Letters vol. 2 2002 No. 7 p. 729-732.*
J. Hone et al. 2004 Growth of Nanotubes and Chemical Sensors Applications Center of Electric Transport in Molecular Structures Columbia University, NY NY*
Wang et al., "Directed Assembly of Nanowires", Materials Today, vol. 12 No. 5, (May 2009) pp. 34-43.*
Palumbo et al., "Layer-by-Layer Thin Films of Carbon Nanotubes", Materials Research Society Symposium Proceedings, vol. 901E, (2006).*
"SNOWTEX", Nissan Chemicals, (no. date available).*
Ajayan, "How does a Nanofibre Grow?", Nature, vol. 427 No. 29, (Jan. 29, 2004), pp. 402-403.*
Hu, L. et al., "Percolation in Transparent and Conducting Carbon Nanotube Networks", Nano Letters, vol. 4, No. 12, 2004, pp. 2513-2517.
Zhang, Daihua et al., "Transparent, Conductive, and Flexible Carbon Nanotube Films and Their Application in Organic Light-Emitting Diodes", Nano Letters, vol. 6, No. 9, 2006, pp. 1880-1886.
Zhang, Meining et al., "Electrostatic Layer-by-Layer Assembled Carbon Nanotube Multilayer Film and Its Electrocatalytic Activity for $O_2$ Reduction", Langmuir, vol. 20, No. 20, 2004, pp. 8781-8785.

* cited by examiner

Primary Examiner — Nathan Empie
Assistant Examiner — Lisha Jiang
(74) Attorney, Agent, or Firm — Dorsey & Whitney LLP (57) ABSTRACT

The present disclosure generally relates to conductive films and methods for forming conductive films. In some examples, a substrate may be provided having a dispersion of silica nanoparticles provided on a surface thereof. Carbon nanotubes may be adhered to the dispersion of silica nanoparticles on the surface of the substrate to provide the conductive film on the substrate.

24 Claims, 5 Drawing Sheets

CARBON NANOTUBE TRANSPARENT FILMS

BACKGROUND

Generally, transparent conducting films (also referred to as transparent films) have been used for substrates of electronic displaying elements such as a liquid crystal displaying element, an organic electroluminescent element, a plasma display, an electronic paper, an electronic optical element, a solar cell substrate and so forth. The transparent films commonly comprise transparent plates having a conducting (or conductive) layer provided thereon. The transparent plates can comprise glass, plastic, or other suitable material substrates.

Two basic approaches exist to forming a transparent conducting film. In a first approach for forming a transparent conducting film, a wide bandgap semiconductor material is used for the conducting layer. Such semiconductor material may be, for example, indium tin oxide ("ITO"). The semiconductor material can be deposited uniformly as a thin film by processes such as sputter deposition. A second approach for forming a transparent conducting film involves forming a biphasic system comprising a low loading of an opaque conductor in a transparent, insulating matrix. Commonly, carbon nanotubes are used as an opaque conductor because of their high inherent conductivity and their high aspect ratio, both of which facilitate contact between one tube and another, even along a large distance.

In a conventional bundle of carbon nanotubes (CNTs) provided on a substrate, as tube loading increases, the number of tube-tube contacts increases. At the same time, however, the transparency of the conductive layer and of the film decreases.

BRIEF DESCRIPTION OF THE FIGURES

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are implicitly contemplated herein.

Illustrative examples herein describe transparent films comprising a substrate and a conductive layer formed of carbon nanotubes and silica nanoparticles, and methods of manufacturing such transparent films. Many other examples are also possible, but time and space limitations prevent including an exhaustive list of those examples in one document. Accordingly, other examples within the scope of the claims will become apparent to those skilled in the art from the teachings of the present disclosure.

The conductivity of nanotube films may be improved by casting bundles of nanotubes instead of dispersions of soluble tubes, but it is difficult to cast uniform thin films using such an approach. By using bundles of nanotubes, tubes in the bundle may have multiple opportunities to contact one another. A method may be arranged to aggregate nanotubes into bundles that may be casted as thin films.

Figure 1:
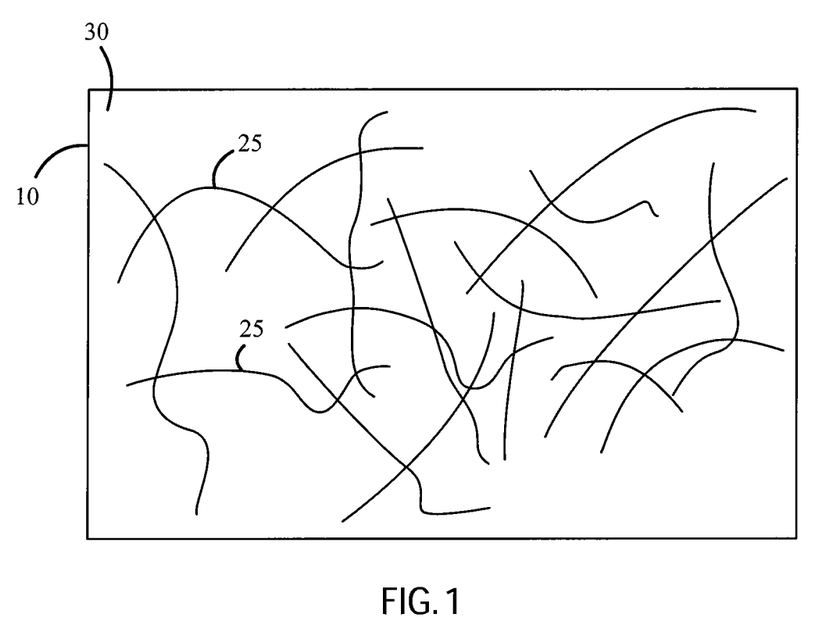
FIG. 1 depicts a substrate 10 having silica nanoparticles 25 deposited thereon, in accordance with some examples provided herein.
Figure 2:
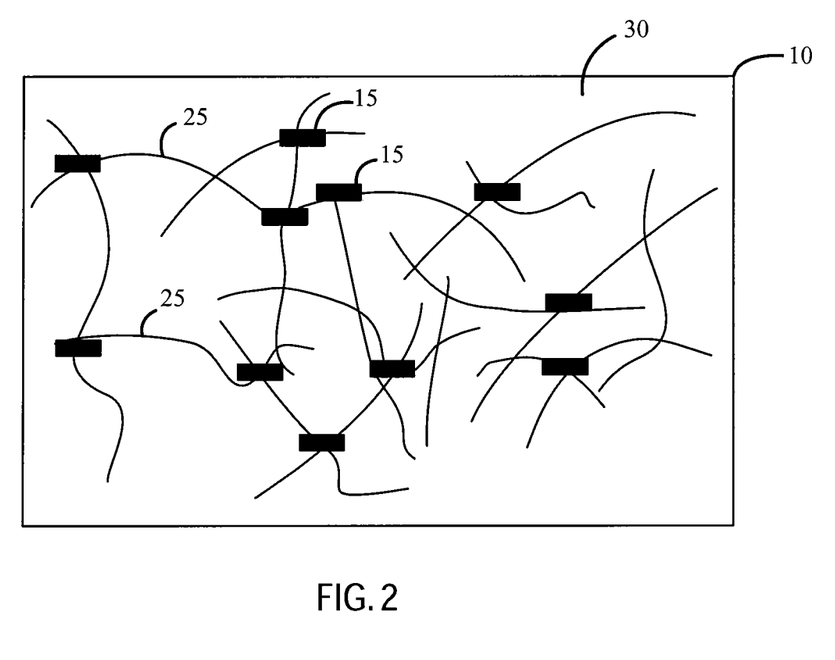
FIG. 2 depicts a transparent film formed by depositing carbon nanotubes 25 on the substrate 10 of FIG. 1, in accordance with some examples provided herein.

FIG. 1 depicts a substrate 10 having silica nanoparticles 25 deposited thereon, in accordance with some examples of the present disclosure. FIG. 2 depicts a transparent film formed by depositing carbon nanotubes 25 on the substrate 10 of FIG. 1, in accordance with some examples of the present disclosure. Accordingly, as shown, the transparent film may include a substrate 10, including a surface 30, carbon nanotubes 15, and silica nanoparticles 25.

In various implementations, the substrate 10 may be a transparent substrate and may comprise glass, plastic or other suitable materials. A templating layer may be provided on the surface 30 of the substrate 10. The templating layer may comprise, for example, silica nanoparticles 25. In examples where the templating agent comprises silica nanoparticles, the silica nanoparticles may be provided as a network or dispersion. In various implementations, the silica nanoparticles 25 may be provided in a random distribution. An intermediate layer (not shown) may also be provided between the substrate 10 and the layer of silica nanoparticles 25 to associate the silica nanoparticles with the surface 30 of the substrate 10.

To form a transparent film, a conductive layer may be formed on a surface 30 of the substrate 10. The conductive layer may be formed of a conductive material such as carbon nanotubes 15. The carbon nanotubes 15 may provided over a templating layer, such as that provided by the silica nanoparticles 25. The carbon nanotubes 15 thus may be associated with the silica nanoparticles 25. As shown in FIG. 2, bundles of carbon nanotubes 15 may be provided on the surface 30 of the substrate 10 by association with the silica nanoparticles 25.

The silica nanoparticles 25 may act as a templating agent that may increase the alignment of the carbon nanotubes 15 along nanoscopic segments of the carbon nanotubes, thus allowing increased metal-metal tube contact. Increased metal-metal tube conductivity in turn increases the conductivity along the substrate 10. The silica nanoparticles 25 may increase the conductivity of the transparent film, which may result in an increase in transparency of the transparent film. Because of the increased conductivity, a lesser amount of carbon nanotubes may be used for a transparent film than were used on substrates in the prior art. Accordingly, a transparent film having enhanced conductivity and increased transparency may be provided.

The silica nanoparticles 25 may be provided as elongated silica nanoparticles, which may range between approximately 100 nm and approximately 200 nm in length, and may be approximately 10 nm in diameter, although other lengths and diameters are possible. In some examples, the surface of the silica nanoparticles may also be modified with adhesion promoters (e.g., epoxy resin). Such modification may enhance the association of the silica particles with the substrate 10.

Commercially available elongated silica particles may be used, such as Nissan Chemical Company's Snowtex-UP® or Snowtex-PS®, to template the formation of carbon nanotube bundles. Snowtex-UP® is a dispersion of silica particles with diameters of 10-15 nm and aspect ratios from 5:1 to 10:1. Relative to carbon nanotubes, these materials may be inexpensive and easier to process, and have excellent reproducibility.

Figure 3:
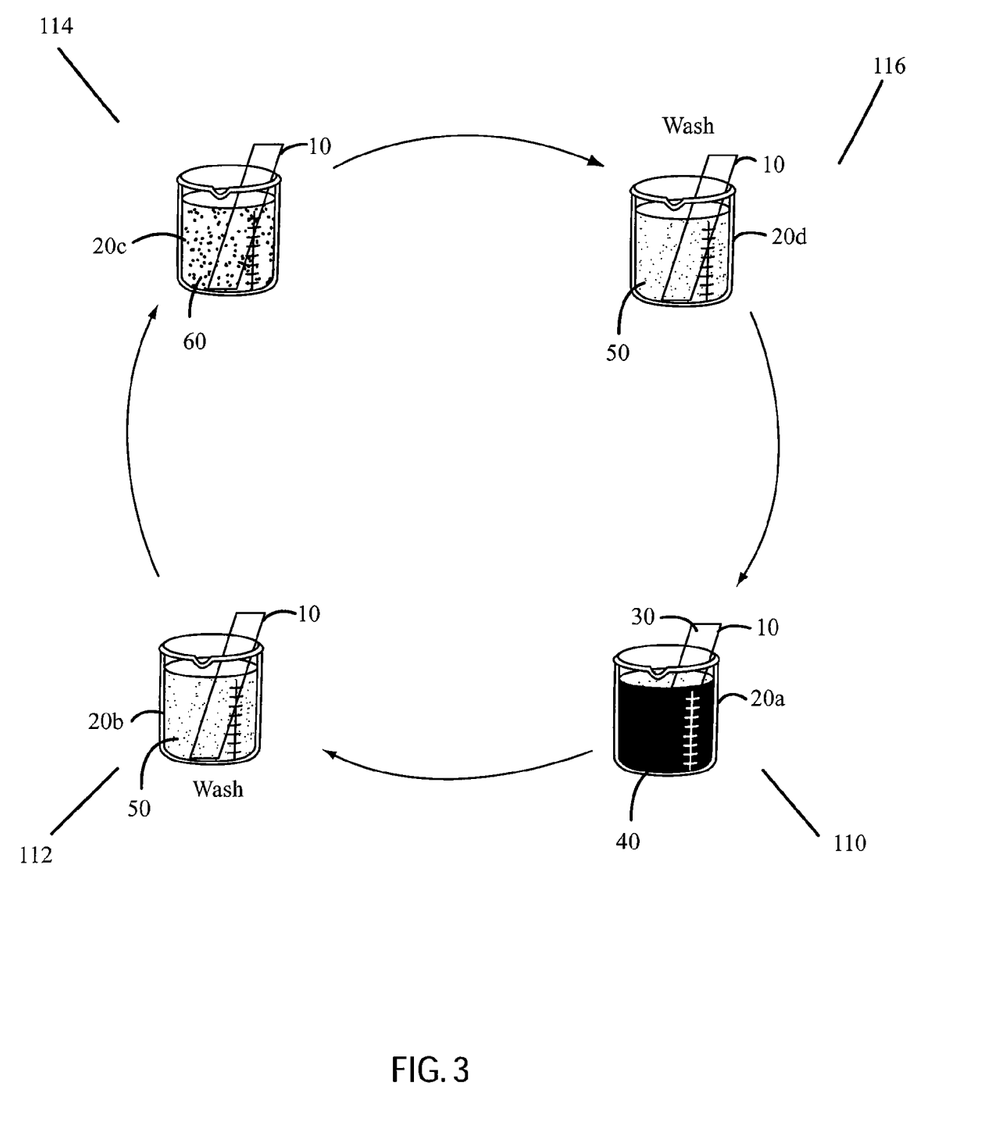
FIG. 3 depicts forming a transparent film in accordance with an example method provided herein.

FIG. 3 depicts forming a transparent film in accordance with at least some example methods of the present disclosure. The transparent film may be an electrically conductive film comprising the silica nanoparticles and carbon nanotubes. In the example shown, carbon nanotubes 15 with a cationic surfactant may be adhered to anionic silica nanoparticles 25 by electrostatic self-assembly. FIG. 3 includes numbering to designate illustrative components of examples shown within the drawings, including the following: a substrate 10, carbon nanotubes 15, silica nanoparticles 25, a surface 30 of the substrate 10, containers 20(a)-20(d), a polycation solution 40, water 50, and a polyanionic solution 60. Generally, providing silica nanoparticles on a substrate is shown at 110, washing the substrate in a solution is shown at 112, providing carbon nanotubes on the substrate is shown at 114, and washing the substrate in a solution is shown at 116. It is to be appreciated that, while FIG. 3 specifically illustrates formation of a transparent film using silica nanoparticles as a templating agent and carbon nanotubes as a conductive material, other templating agents and/or other conductive materials may be used.

As shown at 110, a random network of silica nanoparticles (or other templating agent) may be provided on a substrate 10. In some examples, the silica nanoparticles may be provided by a method such as spin-coating. Spin-coating is a procedure that may be used to apply uniform thin films to substantially flat substrates where an excess amount of a solution may be placed on a substrate, and the substrates may then be rotated at high speed in order to spread the fluid by centrifugal force. In this procedure, a substrate 10 may be dipped into an organic solvent such as water or other suitable material containing the silica nanoparticles. The substrate may then be placed inside a machine used for spin coating, called a spin coater, or a spinner, where it is rotated. Rotation may be continued while the fluid spins off the edges of the substrate 10, until a desired thickness of a film on top of the substrate may be achieved. The organic solvent may be volatile, thus evaporating during spinning. A higher angular speed during spinning may achieve a thinner film on the substrate. The thickness of the film may also depend on the concentration of the solution and the solvent. The silica nanoparticles 25 may be accompanied by a binder in order to prevent aggregation of the silica nanoparticles. The binder is added to the silica nanoparticles before providing the silica nanoparticles on the surface of the substrate. This binder may subsequently be removed after providing the silica nanoparticles on the surface of the substrate by a step such as thermal treatment, chemical etch, or solvent.

Alternatively, the silica nanoparticles 25 may be associated with a substrate 10 by dip coating, using a method such as electrostatic self-assembly. In dip coating, the substrate 10 can be immersed into a tank or container containing a coating material, such as a solvent and the silica particles, removing the substrate 10 from the tank, and allowing it to drain. The coated substrate can then be dried by air drying, force-drying or baking.

In electrostatic self-assembly, the silica nanoparticles may be provided in a polycation solution 40, which can comprise water or other organic solvents. Initially, the substrate 10 has a negative charge and is then inserted into a tank or container 20a with the polycation solution 40. The silica nanoparticles 25 in the polycation solution 40 can adhere to the surface 30 of the substrate 10. Generally, as shown at 112, the substrate 10 may then be removed from the container 20a, and can be washed in water 50 or some other suitable solution in another container 20b to rinse the polycation solution 40 off the substrate 10.

As shown at 114, the substrate 10 may be removed from the container 20b, and inserted into a container 20c having a polyanionic solution 60. The polyanionic solution contains carbon nanotubes 15 (or other conductive material). Due to the opposite charge between the silica nanoparticles 25 and the carbon nanotubes in the polyanionic solution 60, the carbon nanotubes 15 may attach to the surface of the substrate 10 with the silica nanoparticles 25. The carbon nanotubes 15 may naturally tend to align with the silica nanoparticles 25 due to an aspect ratio of the silica nanoparticles 25. Multiple carbon nanotubes 15 may align with each silica nanoparticle 25 because the diameter of the silica nanoparticles 25 is an order of magnitude greater than that of the carbon nanotubes. The substrate 10 may then be removed from the container 20c, and may be washed in container 20d with water 50 or other solution as shown at 116 to rinse the polyanionic solution 60 off the substrate.

When using electrostatic self-assembly for both deposition of the templating agent and deposition of the conductive material, the process may be repeated to make a film that is sufficiently thick to have good surface conductivity, as each individual step may only build a few nanometers of film at a time. Thus, the process shown in FIG. 3 may be repeated several times. Each dip coat may add a layer of thickness in a range of approximately 0.5 nm to approximately 2 nm. The film, comprising the templating agent and the conductive material, may in some examples have a thickness in a range of approximately 10 nm to approximately 20 nm, which may take approximately 5-20 dip coats, which may be varied.

Figure 4:
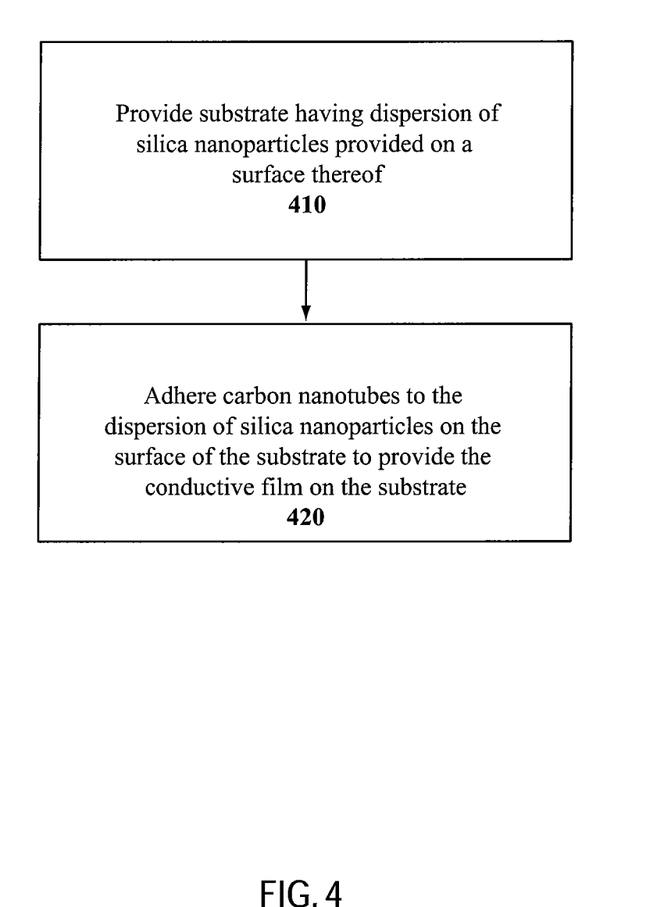
FIG. 4 depicts a flow diagram illustrating a method of forming a transparent film comprising a substrate and a conductive material, in accordance with some examples provided herein.

FIG. 4 depicts a flow diagram a method of forming a transparent film comprising a substrate and a conductive material, in accordance with some examples of the present disclosure. FIG. 4 includes numbering to designate illustrative components of examples shown within the drawings, including various operations for forming the transparent film as illustrated by blocks 410 and 420.

Initially, as shown at block 410, a substrate may be provided having a dispersion of silica nanoparticles provided on a surface thereof. In some examples, an alternative templating agent may be provided on the surface. As shown at block 420, carbon nanotubes may adhere to the dispersion of silica nanoparticles on the surface of the substrate to provide a conductive film on the substrate. In some examples, an alternative conductive material may be adhered dispersion of silica nanoparticles (or other templating agent). While adherence is specifically described, other manners of associating the conductive material with the templating agent may alternatively be used.

Figure 5:
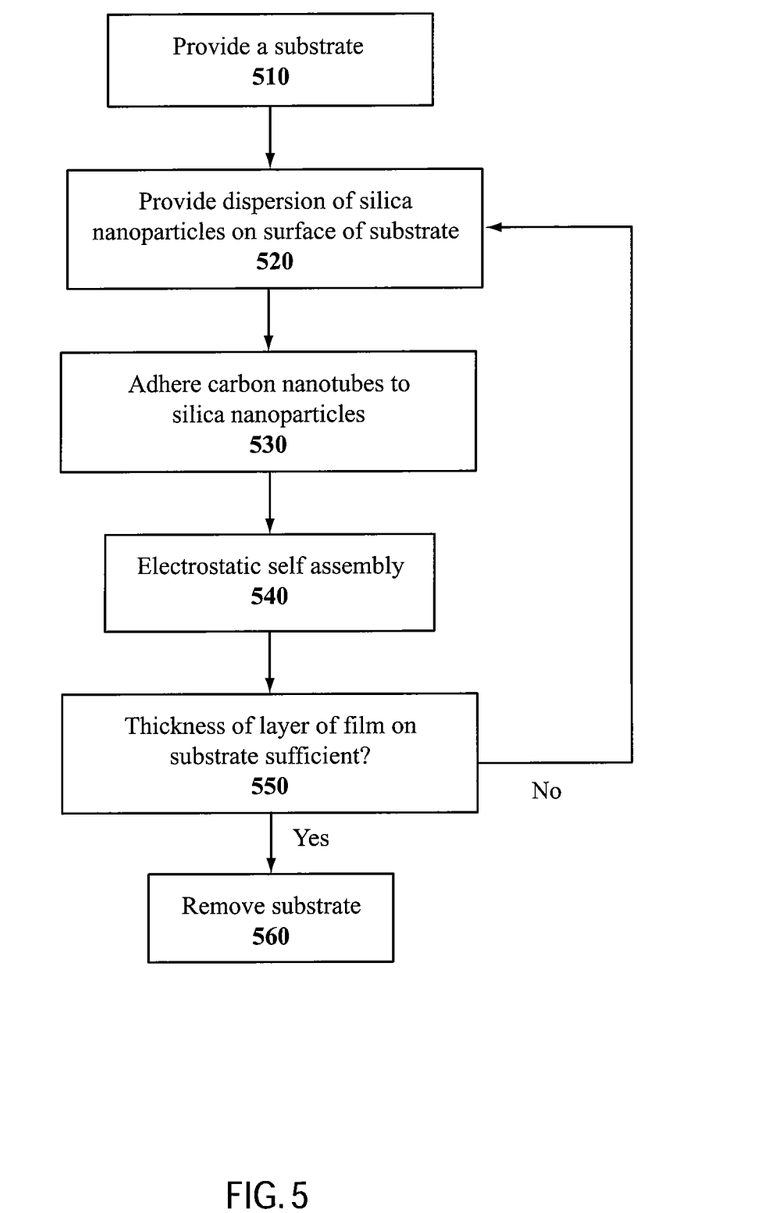
FIG. 5 depicts a flow diagram illustrating an additional example methods of forming a transparent film comprising a substrate and a conductive material, in accordance with some examples provided herein.

FIG. 5 depicts a flow diagram illustrating an additional example methods of forming a transparent film comprising a substrate and a conductive material, in accordance with some examples of the present disclosure. FIG. 5 includes numbering to designate illustrative components of examples shown within the drawings, including operations for forming the transparent film as illustrated by blocks 510, 520, 530, 540, 550 and/or 560.

Initially, as shown at block 510, a substrate may be provided. A dispersion of silica nanoparticles may be provided on a surface of the substrate at block 520, as described above. In other examples, an alternative templating agent may be provided on the surface of the substrate. As shown at block 530, carbon nanotubes can adhere to the silica nanoparticles, for example by electrostatic self assembly. In some examples, an alternative conductive material may be adhered dispersion of silica nanoparticles (or other templating agent). While adherence is specifically described, other manners of associating the conductive material with the templating agent may alternatively be used. As shown at block 540, the process may determine if the thickness of the film layer on the surface of the substrate is sufficient, which can be predetermined based on the use of the substrate. Such determination may be done manually or via computer implementation. If the thickness is determined as sufficient, the transparent film is complete and the substrate may be removed. If the thickness is determined as not sufficient, the process can be repeated and silica nanoparticles are again placed on the surface of the substrate at block 520.

Figure 6:
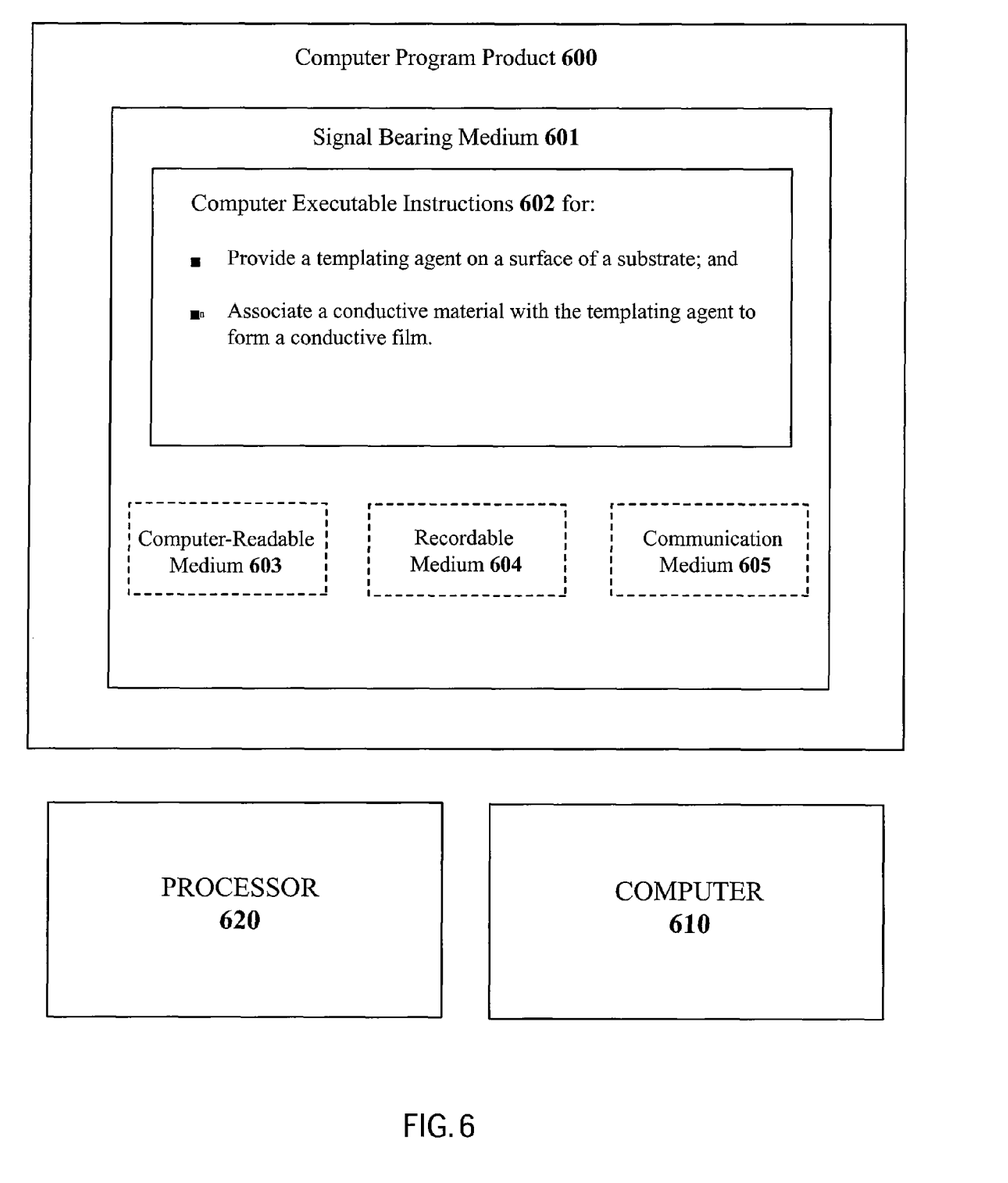
FIG. 6 illustrates a block diagram of an example computer program product, all arranged in accordance with at least some examples of the present disclosure.

FIG. 6 illustrates a block diagram of an example computer program product 600, a computer 610 and a processor 620 in accordance with at least some examples of the present disclosure. In some examples, as shown in FIG. 6, computer program product 600 includes a signal bearing medium 601 that may also include computer executable instructions 602. Computer executable instructions 602 may be arranged to provide instructions for forming a conductive film. Such instructions may include, for example, instructions relating to providing a templating agent on a surface of a substrate. Such instructions further may include, for example, instructions relating to associating a conductive material with the templating agent to form a conductive film. Generally, the computer executable instructions 602 may include instructions for performing any steps of the method for forming a conductive film described herein. The instructions are executable by the processor 620, which may be a part of the computer 610.

Also depicted in FIG. 6, in some examples, a computer product 600 may include one or more of computer executable instructions 602, a computer readable medium 603, a recordable medium 604 and a communications medium 605. The dotted boxes around these elements may depict different types of mediums that may be included within, but not limited to, signal bearing medium 601. These types of mediums may distribute programming instructions 602 to be executed by a computer processor 620 of computer 610, or other computer devices including processors, logic and/or other facility for executing such instructions. Computer readable medium 603 and recordable medium 604 may include, but are not limited to, a flexible disk, a hard disk drive (HDD), a Compact Disc (CD), a Digital Video Disk (DVD), a digital tape, a computer memory, etc. Communication medium 605 may include, but is not limited to, a digital and/or an analog communication medium (e.g., a fiber optic cable, a waveguide, a wired communication link, a wireless communication link, etc.).

The surface of the templating agent, such as silica nanoparticles, may be modified to create materials that vary significantly in solubility and chemical reactivity. Such modification may be made to improve processability, substrate-silica binding, and/or to improve the interaction of the silica with nanotubes.

Transparent films formed in accordance with the examples described herein may include a conductive material templated by a templating agent. In specific examples described, transparent films may comprise bundles of carbon nanotubes templated by the elongated silica particles. For a given level of transparency, the conductivity of such films may be improved relative to the state of the art today. By aligning the carbon nanotubes in the manners described in the present disclosure, the chances of a metal-metal tube intersection is significantly increased. Using a bundle of carbon nanotubes with the elongated silica nanoparticles as a templating agent may allow sufficient high quality metal-metal tube contacts to sustain a percolation path across the surface of the substrate, using a minimum number of tubes.

The transparency for the substrate formed by methods described herein may be approximately 85% or better, thus enhancing conductivity without sacrificing transparency. The number of bundles of carbon nanotubes and silica nanoparticles may be selected so as to maximize the conductivity without sacrificing transparency, and keeping transparency above approximately 85%, and even above approximately 90%.

The various aspects, features or implementations of examples of the present disclosure described herein can be used alone or in various combinations. The method examples of the present disclosure can be implemented by software, hardware or a combination of hardware and software (e.g., software stored on a computer-accessible medium).

The present disclosure is not to be limited in terms of the particular examples described in this application, which are intended as illustrations of various aspects. Many modifications and examples can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosure is to be limited only by the terms of the appended claims, along with the full scope of equivalents to which such claims are entitled. It is to be understood that this disclosure is not limited to particular devices, methods, systems, which can, of course, vary. It is also to be understood that the terminology used herein is for the purpose of describing particular examples only, and is not intended to be limiting.

The foregoing describes various examples of transparent films used for nanowiring and methods for forming nanowires on a substrate. Following are specific examples of methods and transparent films thereof. These are for illustration only and are not intended to be limiting. The present disclosure generally relates to a method for forming a transparent film for nanowiring.

Some examples include transparent films comprising substrates with bundles of carbon nanotubes, and silica nanoparticles may be provided as a templating agent to allow more metal-metal tube contacts for improving the conductivity of the transparent film. By using silica nanoparticles, uniform bundles of carbon nanotubes may be prepared that maintain much of the optical advantages of singulated nanotubes, but with improved conductivity. The transparent films may then be used for a wide variety of applications as transparent conductive films for the solar cell and flat panel display markets, as well as other similar applications.

Provided and described herein is an example method for forming a conductive film, the method comprising providing a substrate, providing a templating agent on a surface of the substrate, and associating a conductive material with the templating agent to form the conductive film. In some examples, the conductive material may comprise carbon nanotubes and the templating agent can comprise silica nanoparticles. In some examples, providing the templating agent comprises providing a dispersion of silica nanoparticles on the surface of the substrate. The silica nanoparticles may provide for a greater number of tube to tube contacts between the carbon nanotubes to increase conductivity of the conductive film. The silica nanoparticles may be disposed on the surface of the substrate in a random network arrangement. The silica nanoparticles may be provided on the surface of the substrate by one or more of spin-coating, dip coating, or dip coating by electrostatic self assembly.

Some methods may further comprise adding a binder to the silica nanoparticles before providing the silica nanoparticles on the surface of the substrate, and removing the binder after providing the silica nanoparticles on the surface of the substrate. The carbon nanotubes may be adhered to the silica nanoparticles by electrostatic self-assembly. The silica nanoparticles may be anionic. Some methods may further comprise adding a cationic surfactant to the carbon nanotubes. The silica nanoparticles may have a length in a first range from approximately 100 nanometers to approximately 200 nanometers, and the carbon nanotubes may have a length in a second range from approximately 1 micron to approximately 2 microns. The substrate may comprise one or more of glass, and/or a material with a transparency greater than approximately 85%, in some examples.

Also provided and described herein, for example, is a conductive film comprising a substrate, and an electrically conductive film comprising silica nanoparticles dispersed on a surface of the substrate, and carbon nanotubes adhered to the silica nanoparticles on the surface of the substrate. The silica nanoparticles may be elongated silica nanoparticles, and may be dispersed in a random network on the surface of the substrate. Multiple carbon nanotubes may adhere to each silica nanoparticle.

Also provided and described herein, for example, are computer accessible mediums having stored thereon computer executable instructions for forming a conductive film, the forming comprising providing a templating agent on a surface of a substrate, and associating a conductive material with the templating agent to form the conductive film. The templating agent may comprise silica nanoparticles, and the conductive material may comprise carbon nanotubes.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. A method for forming a conductive film, comprising:
providing elongated anionic silica nanoparticles on a surface of a substrate;
adding a cationic surfactant to a plurality of carbon nanotubes; and
depositing the carbon nanotubes on the substrate and aligning the carbon nanotubes with the elongated anionic silica nanoparticles on the surface of the substrate to form the conductive film.

2. The method of claim 1, wherein elongated silica nanoparticles have a first length in a first range from approximately 100 nanometers to approximately 200 nanometers, and the carbon nanotubes have a second length in a second range from approximately 1 micron to approximately 2 microns.

3. The method of claim 1, wherein the substrate comprises one or more of glass, and/or a material with a transparency greater than approximately 85%.

4. The method of claim 1, wherein multiple carbon nanotubes are adhered to each elongated anionic silica nanoparticle.

5. The method of claim 1, wherein the elongated anionic silica nanoparticles have an aspect ratio selected to promote alignment of the carbon nanotubes with the elongated anionic silica nanoparticles.

6. The method of claim 1, further comprising measuring a thickness of the layer of conductive material to determine if the thickness corresponds to a desired thickness, and if the thickness is less than the desired thickness, repeating the steps of providing elongated anionic silica nanoparticles and associating carbon nanotubes with the elongated anionic silica nanoparticles.

7. The method of claim 1, wherein the anionic silica nanoparticles are elongated silica nanoparticles and wherein the carbon nanotubes are aligned in a direction of elongation of the silica nanoparticles.

8. The method of claim 1, wherein providing elongated anionic silica nanoparticles comprises providing a dispersion of elongated silica nanoparticles on the surface of the substrate.

9. The method of claim 1, wherein providing elongated anionic silica nanoparticles comprises disposing elongated silica nanoparticles on the surface of the substrate in a random network arrangement.

10. The method of claim 1, wherein providing elongated anionic silica nanoparticles comprises providing elongated silica nanoparticles on the surface of the substrate by one or more of spin-coating or dip coating.

11. The method of claim 1, further comprising adding a binder to the elongated anionic silica nanoparticles before providing the elongated anionic silica nanoparticles on the surface of the substrate.

12. The method of claim 11, further comprising removing the binder after providing the elongated anionic silica nanoparticles on the surface of the substrate.

13. The method of claim 1, wherein aligning the carbon nanotubes with the elongated silica nanoparticles includes adhering the carbon nanotubes to the elongated silica nanoparticles by electrostatic self-assembly.

14. A method of forming a conductive film, the method comprising:
depositing elongated silica nanoparticles on a surface of a substrate; and
adhering carbon nanotubes to the elongated silica nanoparticles by electrostatic self-assembly such that the carbon nanotubes are aligned with the elongated silica nanoparticles.

15. The method of claim 14, wherein depositing elongated silica nanoparticles comprises providing silica nanoparticles on the surface of the substrate, wherein the silica nanoparticles are provided in one or more of a dispersion, a network arrangement, or a random distribution.

16. The method of claim 14, wherein depositing elongated silica nanoparticles comprises providing silica nanoparticles on the surface of the substrate by one or more of spin-coating, dip coating, or dip coating by electrostatic self-assembly.

17. The method of claim 14,
wherein the elongated silica nanoparticles have an aspect ratio selected to promote alignment of the carbon nanotubes with the elongated silica nanoparticles.

18. The method of claim 14, wherein depositing elongated silica nanoparticles comprises providing anionic silica nanoparticles on the surface of the substrate, the method further comprising adding a cationic surfactant to the carbon nanotubes.

19. The method of claim 14, wherein the substrate comprises glass, a material with a transparency greater than approximately 85%, or combinations thereof.

20. The method of claim 14, further comprising adding a binder to the elongated silica nanoparticles before providing the elongated silica nanoparticles on the surface of the substrate.

21. The method of claim 20, further comprising removing the binder after providing the elongated silica nanoparticles on the surface of the substrate.

22. The method of claim 14, wherein the elongated silica nanoparticles have a first length in a first range from approximately 100 nanometers to approximately 200 nanometers, and the carbon nanotubes have a second length in a second range from approximately 1 micron to approximately 2 microns.

23. The method of claim 14, wherein adhering comprises adhering multiple carbon nanotubes to each silica nanoparticle.

24. The method of claim 14, wherein the carbon nanotubes are aligned in a direction of elongation of the silica nanoparticles.

* * * * *

UNITED STATES PATENT AND TRADEMARK OFFICE
CERTIFICATE OF CORRECTION

| | |
|---|---|
| PATENT NO. | : 8,435,595 B2 |
| APPLICATION NO. | : 12/503619 |
| DATED | : May 7, 2013 |
| INVENTOR(S) | : Miller |

It is certified that error appears in the above-identified patent and that said Letters Patent is hereby corrected as shown below:

In the Drawings:

In Fig. 6, Sheet 5 of 5, in Box "605", in Line 1, delete "Communication" and insert
-- Communications --, therefor. (See attached sheet)

In the Specification:

In Column 1, Line 44, delete "substrate 10 having silica nanoparticles 25" and insert
-- substrate having silica nanoparticles --, therefor.

In Column 1, Line 48, delete "carbon nanotubes 25 on the substrate 10" and insert
-- carbon nanotubes on the substrate --, therefor.

In Column 2, Line 31, delete "carbon nanotubes 25" and insert -- carbon nanotubes 15 --, therefor.

In Column 5, Line 23, delete "540," and insert -- 550, --, therefor.

In Column 5, Lines 50-51, delete "computer product 600" and insert
-- computer program product 600 --, therefor.

In Column 5, Line 64, delete "Communication medium 605" and insert
-- Communications medium 605 --, therefor.

Signed and Sealed this
Twentieth Day of August, 2013

Teresa Stanek Rea
*Acting Director of the United States Patent and Trademark Office*

FIG.6